(12) United States Patent
Narazaki et al.

(10) Patent No.: US 7,325,304 B2
(45) Date of Patent: Feb. 5, 2008

(54) METHOD OF CONNECTING PROBE PIN TO CIRCUIT BOARD AND METHOD OF MANUFACTURING PROBE CARD

(75) Inventors: Wataru Narazaki, Tokyo (JP); Tadao Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 276 days.

(21) Appl. No.: 11/142,806

(22) Filed: Jun. 1, 2005

(65) Prior Publication Data

US 2005/0258847 A1 Nov. 24, 2005

Related U.S. Application Data

(63) Continuation of application No. PCT/JP03/15477, filed on Dec. 3, 2003.

(30) Foreign Application Priority Data

Dec. 3, 2002 (JP) ............... 2002-351763

(51) Int. Cl.
*H01R 43/20* (2006.01)
(52) U.S. Cl. ............... 29/876; 29/874; 29/842; 29/846; 29/847; 427/97.1; 427/117; 324/761
(58) Field of Classification Search ............... 29/874, 29/876, 842, 846, 847, 417; 427/97.1, 98.4, 427/117; 205/122, 118; 438/48, 98
See application file for complete search history.

(56) References Cited

U.S. PATENT DOCUMENTS 5,998,228 A * 12/1999 Eldridge et al. ............ 438/15
6,830,461 B2 * 12/2004 Sakamoto et al. ............ 439/66
7,073,254 B2 * 7/2006 Eldridge et al. ............ 29/843
2001/0002341 A1 * 5/2001 Eldridge et al. ............ 439/66
2004/0154165 A1 * 8/2004 Takoshima et al. ............ 29/846

FOREIGN PATENT DOCUMENTS

JP  1-287484  11/1989
JP  2002-277485  9/2002

OTHER PUBLICATIONS

Patent Abstracts of Japan, Publication No. 01-287484 dated Nov. 20, 1989 (2 pages).
Patent Abstracts of Japan, Publication No. 2002-277485 dated Sep. 25, 2002 (2 pages).
International Search Report issued in International Application No. PCT/JP03/15477 mailed Mar. 30, 2004 (1 page).

* cited by examiner

*Primary Examiner*—Peter Vo
*Assistant Examiner*—Michael T Hess
(74) *Attorney, Agent, or Firm*—Osha Liang LLP

(57) ABSTRACT

There is provided a method of manufacturing a probe card that electrically connects a testing device and a device under test to transmit a signal between the testing device and the device under test. The method includes the steps of forming a probe pin on a probe pin substrate, joining the probe pin held on the probe pin substrate to a circuit board, and cutting the probe pin to separate the probe pin substrate from the probe pin.

7 Claims, 6 Drawing Sheets

METHOD OF CONNECTING PROBE PIN TO CIRCUIT BOARD AND METHOD OF MANUFACTURING PROBE CARD

CROSS REFERENCE TO THE RELATED APPLICATION

The present application is a continuation application of PCT/JP03/15477 filed on Dec. 3, 2003, which claims priority from a Japanese Patent application No. 2002-351763 filed on Dec. 3, 2002, the entire contents of which are incorporated herein by reference for all purposes.

BACKGROUND OF THE INVENTION

1. Field of the Invention

The present invention relates to a method of connecting a probe pin to a circuit board and a method of manufacturing a probe card. More particularly, the present invention relates to a method of manufacturing a probe card that electrically connects a testing device and a device under test to transmit a signal between the testing device and the device under test.

2. Description of Related Art

In a conventional method of manufacturing a probe card, a probe pin is mounted by transcription on a circuit board by forming a bump on the probe pin formed on a substrate and bonding the bump by thermocompression to a wiring pad on the circuit board. Then, the substrate is separated from the probe pin by removing the substrate by etching or mechanically exfoliating the substrate as disclosed, for example, in Japanese Patent Laid-Open No. 2002-277485.

However, when the substrate is removed by etching, the etching may affect the probe pin and the circuit board. Moreover, when the substrate is mechanically exfoliated, residual dross of the substrate remains on the probe pin. At this time, when residual dross is large, a range of movement of the probe pin may be limited. Therefore, there has been a problem that defective probe cards increase and thus yield decreases.

SUMMARY OF THE INVENTION

Therefore, it is an object of the present invention to provide a method of connecting a probe pin to a circuit board and a method of manufacturing a probe card that can solve the foregoing problems. The above and other objects can be achieved by combinations described in the independent claims. The dependent claims define further advantageous and exemplary combinations of the present invention.

To solve this problem, according to the first aspect of the present invention, there is provided a method of manufacturing a probe card that electrically connects a testing device and a device under test to transmit a signal between the testing device and the device under test. The method includes the steps of: forming a probe pin on a probe pin substrate; joining the probe pin held on the probe pin substrate to a circuit board; and cutting the probe pin to separate the probe pin substrate from the probe pin.

The probe pin forming step may include the steps of: depositing a sacrifice layer on some portion of a surface of the probe pin substrate; depositing a conductive material from the surface of the probe pin substrate to a surface of the sacrifice layer to form the probe pin; and removing the sacrifice layer to form a portion in which the probe pin is separated from the probe pin substrate, and the probe pin cutting step may include the step of cutting the portion of the probe pin, which is separated from the probe pin substrate.

The manufacturing method may further include the step of forming a bump, which electrically connects electric wiring on the circuit board and the probe pin, ahead of a position in which the probe pin is in contact with the probe pin substrate, and the sacrifice layer removing step may include the step of removing the sacrifice layer to form the portion separated from the probe pin substrate between the position in which the probe pin is in contact with the probe pin substrate and a position in which the probe pin is in contact with the bump.

The manufacturing method may further include the step of bending the probe pin in a direction toward the probe pin substrate, and the sacrifice layer removing step may include the step of removing the sacrifice layer after the probe pin bending step.

The probe pin forming step may include the steps of: depositing a conductive material on a surface of the probe pin substrate to form the probe pin; and removing some portion of the probe pin substrate to form a portion in which the probe pin is separated from the probe pin substrate, and the probe pin cutting step may include the step of cutting the portion of the probe pin, which is separated from the probe pin substrate.

The probe pin forming step may include the step of forming a cut portion in which an area of a cross section generally perpendicular to a drawing direction of the probe pin is smaller than that of the rest of the probe pin, and the probe pin cutting step may include the step of cutting the probe pin at the position of the cut portion. The cut portion forming step may include the step of forming the cut portion having width narrower than that of the rest of the probe pin.

According to the second aspect of the present invention, there is provided a method of connecting a probe pin to a circuit board. The method include the steps of: forming a probe pin on a probe pin substrate; joining the probe pin held on the probe pin substrate to the circuit board; and cutting the probe pin to separate the probe pin substrate from the probe pin.

The summary of the invention does not necessarily describe all necessary features of the present invention. The present invention may also be a sub-combination of the features described above.

DETAILED DESCRIPTION OF THE INVENTION

Figure 1A:
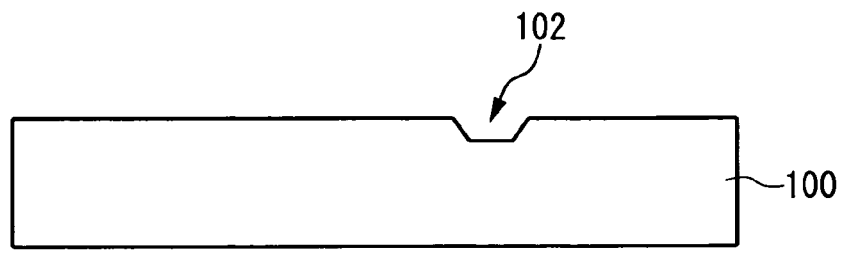
FIGS. 1A to 1D are views exemplary showing a probe pin forming step and a bump forming step.

The invention will now be described based on the preferred embodiments, which do not intend to limit the scope of the present invention, but exemplify the invention. All of the features and the combinations thereof described in the embodiment are not necessarily essential to the invention.

FIGS. 1A to 1D, 2A to 2C, and 3A and 3B are views exemplary showing a method of manufacturing a probe card according to an embodiment of the present invention. The probe pin card electrically connects a testing device and a device under test to transmit a signal between the testing device and the device under test. In addition, a method of manufacturing a probe card is an example of a method of connecting a probe pin of the present invention to a circuit board.

FIGS. 1A to 1D are views exemplary showing a probe pin forming step and a bump forming step. In the probe pin forming step, a probe pin is formed on a probe pin substrate 100. In the bump forming step, a bump 108 that electrically connects electric wiring 114 on a circuit board 112 and the probe pin 106 is formed.

At first, as shown in FIG. 1A, the probe pin substrate 100 that is a substrate forming the probe pin 106 is prepared. The probe pin substrate 100 is, e.g., a silicon substrate. Then, a groove 102 for forming a protruding portion that acts as a contact portion between the probe pin 106 and a device under test is formed on a surface of the probe pin substrate 100. Specifically, a resist having a pattern of the groove 102 is formed on the surface of the probe pin substrate 100. Then, the groove 102 is formed on the substrate 100 by etching using the resist as an etching mask.

Figure 1B:
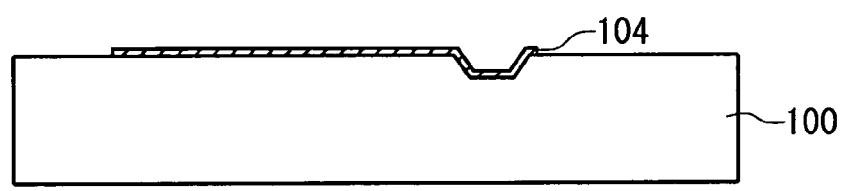

Next, as shown in FIG. 1B, a sacrifice layer 104 is deposited on some portion of the surface of the probe pin substrate 100. The sacrifice layer 104 may be deposited to cover the groove 102. Moreover, it is preferable that the thickness of the sacrifice layer 104 is less than about 1 μm, for example, about 0.5 μm. Moreover, it is preferable that the sacrifice layer 104 is a metal such as aluminum. Specifically, the sacrifice layer 104 is formed by a photolithography technique, an etching technique, a liftoff technique, etc. That is, a resist having a pattern of the sacrifice layer 104 is formed on the surface of the probe pin substrate 100. The sacrifice layer 104 is deposited by, e.g., a sputter technique after removing the resist in the region on which the sacrifice layer 104 should be formed.

Figure 1C:
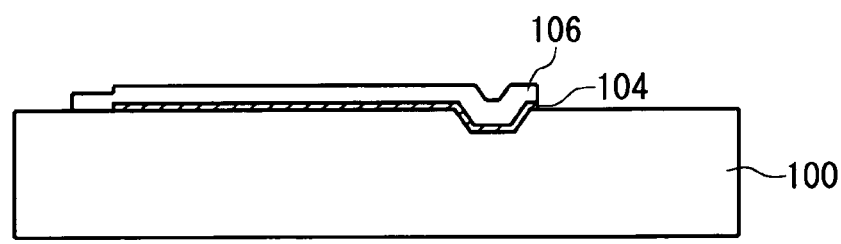

Next, as shown in FIG. 1C, a conductive material is deposited from the surface of the probe pin substrate 100 to a surface of the sacrifice layer 104 in order to form the probe pin 106. The thickness of the probe pin 106 may be about 10 μm. Moreover, it is preferable that the conductive material for forming the probe pin 106 is amorphous alloy. Specifically, the probe pin 106 is formed by a photolithography technique, a liftoff technique, etc. That is, a resist having a pattern of the probe pin 106 is formed on the surfaces of the probe pin substrate 100 and the sacrifice layer 104. The conductive material is deposited by, e.g., a sputter technique to form the probe pin 106 after removing the resist in the region on which the probe pin 106 should be formed.

Figure 1D:
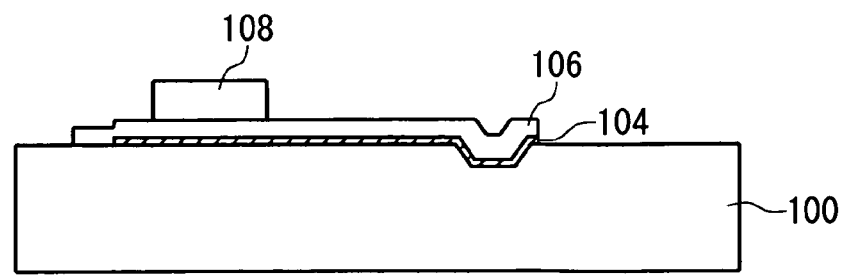

Next, as shown in FIG. 1D, the bump, which electrically connects the electric wiring 114 on the circuit board 112 and the probe pin 106, is formed ahead of a position in which the probe pin 106 is in contact with the probe pin substrate 100. The thickness of the bump 108 may be about 20 μm. Moreover, the length of the bump 108 may be about 200 μm in a drawing direction of the probe pin 106. Moreover, it is preferable that the bump 108 is a metal such as gold. Specifically, the bump 108 may be formed by a bump bonder, or may be formed by plating.

Figure 2A:
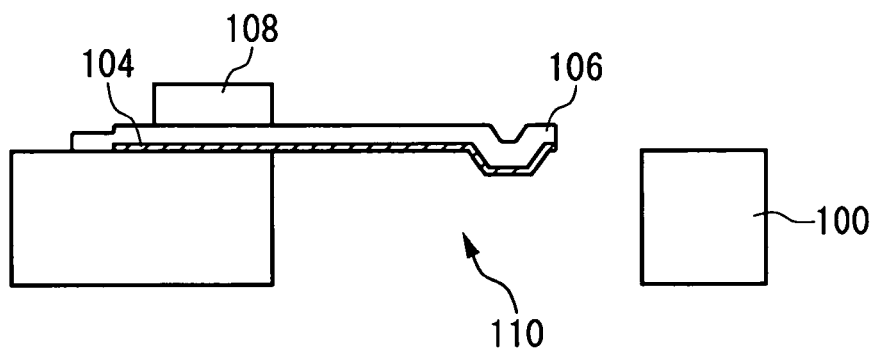
FIGS. 2A to 2C are views exemplary showing a probe pin bending step and a sacrifice layer removing step.
Figure 2B:
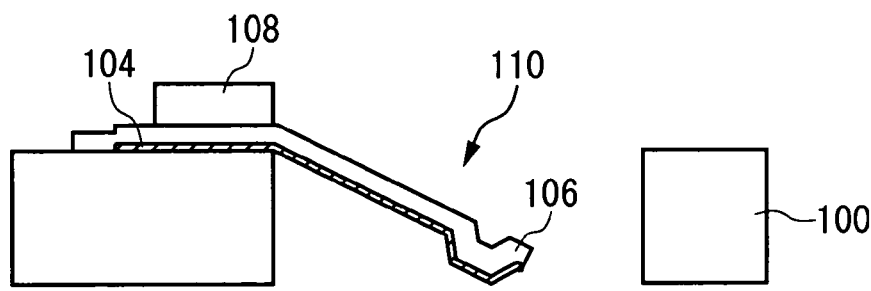
Figure 2C:
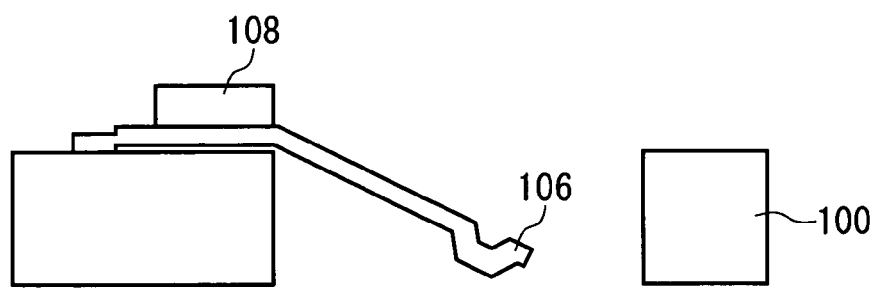

FIGS. 2A to 2C are views exemplary showing a probe pin bending step and a sacrifice layer removing step. In the probe pin bending step, the probe pin 106 is bent in a direction of the probe pin substrate 100. Then, in the sacrifice layer removing step, the sacrifice layer 104 is removed after the probe pin bending step.

At first, as shown in FIG. 2A, a portion including the groove 102 in the probe pin substrate 100 is removed to form a through-hole 110 in the probe pin substrate 100. Specifically, the through-hole 110 is formed from a rear face of the probe pin substrate 100, e.g., by an etching technique such as inductively coupled plasma etching (ICP), wet anisotropic etching.

Next, as shown in FIG. 2B, the probe pin 106 is bent in a direction of the probe pin substrate 100. Specifically, when the probe pin 106 is formed of amorphous alloy, the probe pin 106 is heated so that the amorphous alloy becomes supercooled fluid. Then, a pressing jig is inserted into the through-hole 110, and the probe pin 106 is pressed and bent by the inserted pressing jig.

Next, as shown in FIG. 2C, a portion, in which the probe pin 106 is separated from the probe pin substrate 100, is formed by removing the sacrifice layer 104. It is preferable that the portion separated from the probe pin substrate 100 is formed between the position in which the probe pin 106 is in contact with the probe pin substrate 100 and a position in which the probe pin 106 is in contact with the bump 108. That is, it is preferable that the probe pin 106 is separated from the probe pin substrate 100 from a leading edge of the probe pin 106 to a position farther than that of the bump 108. Specifically, the sacrifice layer 104 is removed by selectively performing wet etching by means of alkali series etchant such as potassium hydroxide.

Figure 3A:
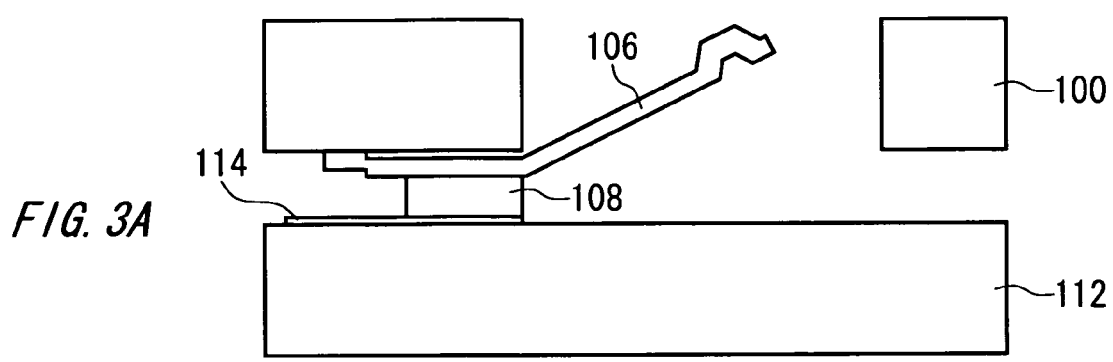
FIGS. 3A and 3B are views exemplary showing a probe pin joining step and a probe pin cutting step.
Figure 3B:
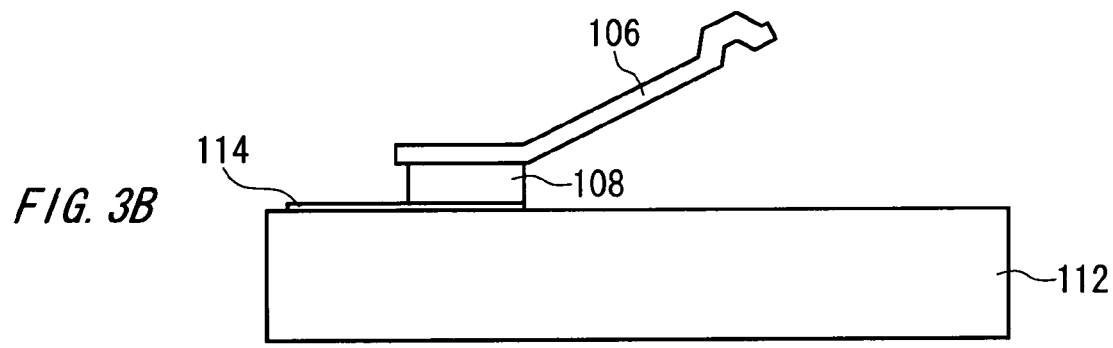

FIGS. 3A and 3B are views exemplary showing a probe pin joining step and a probe pin cutting step. In the probe pin joining step, the probe pin 106 held on the probe pin substrate 100 is joined to the circuit board 112. Then, in the probe pin cutting step, the probe pin substrate 100 is separated from the probe pin 106 by cutting the probe pin 106.

At first, as shown in FIG. 3A, the circuit board 112 on which the electric wiring 114 is formed is prepared. Then, the bump 108 is aligned with the electric wiring 114 and the bump 108 is bonded to the electric wiring 114 by thermocompression. When the probe pin 106 is formed of amorphous alloy, it is preferable that the thermocompression is performed by heating until the amorphous alloy does not become supercooled fluid.

Next, as shown in FIG. 3B, the probe pin substrate 100 is separated by cutting the portion, in which the probe pin 106 is separated from the probe pin substrate 100, between the position in which the probe pin 106 is in contact with the probe pin substrate 100 and the position in which the probe pin 106 is in contact with the bump 108. In the case of bonding the bump 108 to the electric wiring 114 by means of thermocompression, the portion of the probe pin 106 separated from the probe pin substrate 100 is cut by stress when pressing the probe pin substrate 100 toward the circuit board 112.

As shown in FIGS. 1A to 1D, 2A to 2C, and 3A and 3B, the probe pin 106 is mounted by transcription on the circuit board 112 and then the probe card as shown in FIG. 3B is manufactured. In addition, although the method of manufacturing the probe card using one probe pin 106 has been described in FIGS. 1A to 1D, 2A to 2C, and 3A and 3B, the probe card including a plurality of probe pins 106 may be manufactured by forming and transcribing the plurality of probe pins 106 at the same time.

According to the manufacturing method of the probe card of this example, since the probe pin substrate 100 is separated from the probe pin 106 by cutting the probe pin 106, residual dross of the probe pin substrate 100 does not remain on the probe pin 106. Therefore, it is possible to reduce defective probe cards and thus improve yield.

Figure 4A:
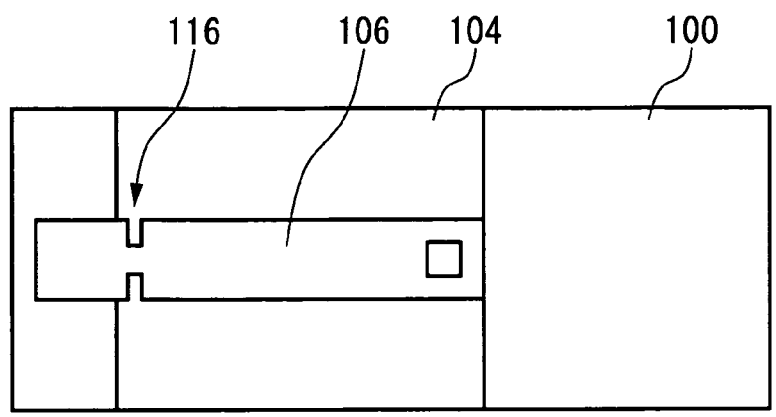
FIGS. 4A to 4C are views exemplary showing a cut portion forming step.
Figure 4B:
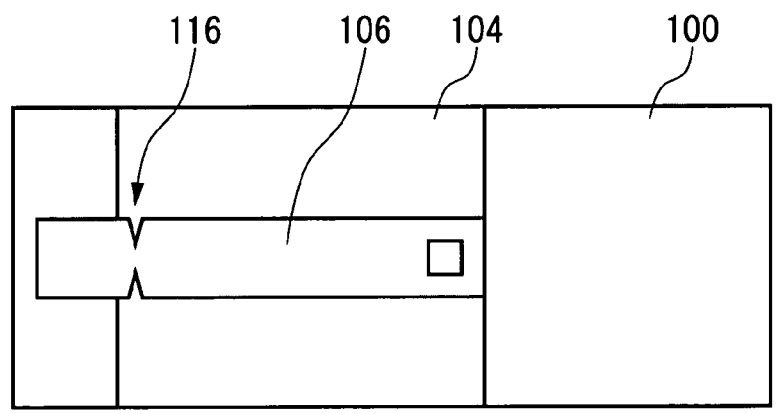
Figure 4C:
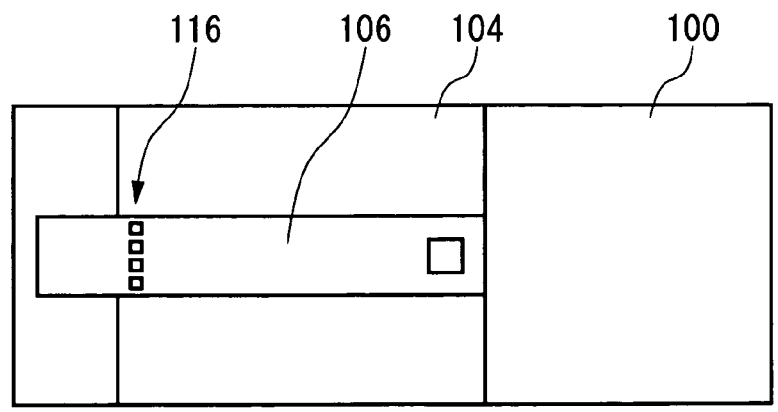

FIGS. 4A to 4C are views exemplary showing a cut portion forming step included in the probe pin forming step, and respectively show an example of a top view of FIG. 1C. In the cut portion forming step, a cut portion 116, in which an area of a cross section generally perpendicular to a drawing direction of the probe pin 106 is smaller than that of the rest of the probe pin 106, is formed.

As shown in FIG. 4A or 4B, the cut portion 116 having width narrower than that of the rest of the probe pin 106 may be formed by incising the probe pin 106. Moreover, as shown in FIG. 4C, the cut portion 116 having an area of a cross section smaller than that of the rest of the probe pin 106 may be formed by perforating the probe pin 106.

Specifically, a resist having a pattern of the probe pin 106 as shown in FIGS. 4A to 4C is formed on the surfaces of the probe pin substrate 100 and the sacrifice layer 104. After removing the resist in the region on which the probe pin 106 should be formed, a conductive material is deposited by, e.g., a sputter technique to form the probe pin 106 having the cut portion 116.

Then, in the probe pin cutting step, the probe pin 106 is cut at the position of the cut portion 116. Since the cut portion 116 having a small sectional area is formed, it is possible to cut the probe pin 106 at a desired position easily and precisely.

FIGS. 5A to 5C and 6A to 6C show another example of the manufacturing method of the probe card according to the present embodiment. In the manufacturing method of the probe card shown in FIGS. 1A to 1D and 2A to 2C, although the separated portion is formed between the probe pin substrate 100 and the probe pin 106 using the sacrifice layer 104, a portion in which the probe pin 106 is separated from the probe pin substrate 100 may be formed by removing some portion of the probe pin substrate 100 in a desired shape without the use of the sacrifice layer 140. That is, the manufacturing method of the probe card according to the present embodiment may include a probe pin forming step, a bump forming step, a probe pin bending step, and a probe pin substrate removing step shown in FIGS. 5A to 5C and 6A to 6C, in place of the probe pin forming step, the bump forming step, the probe pin bending step, and the sacrifice layer removing step shown in FIGS. 1A to 1D and 2A to 2C.

Figure 5A:
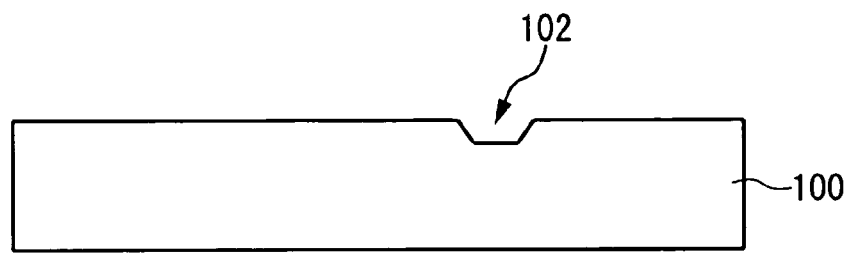
FIGS. 5A to 5C are views exemplary showing a probe pin forming step and a bump forming step.
Figure 5B:
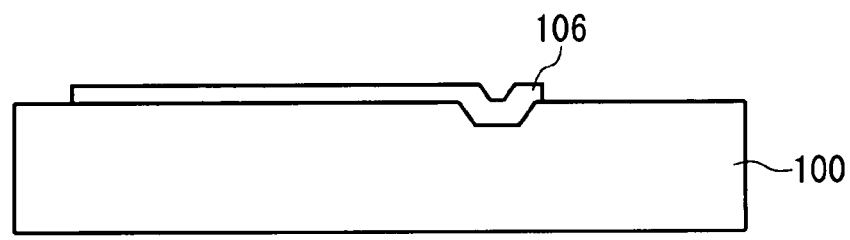
Figure 5C:
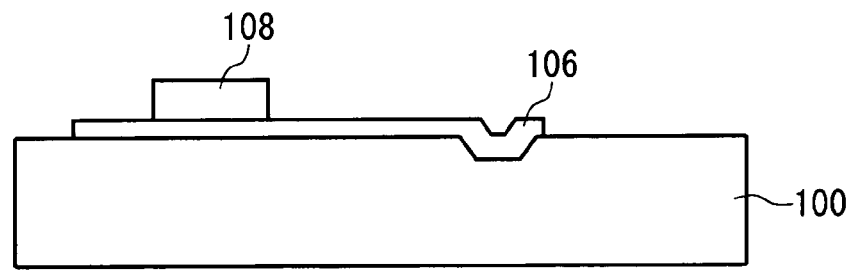

FIGS. 5A to 5C are views exemplary showing a probe pin forming step and a bump forming step. In the probe pin forming step, the probe pin is formed on the probe pin substrate 100. Then, in the bump forming step, the bump 108 that electrically connects the electric wiring 114 on the circuit board 112 and the probe pin 106 is formed.

At first, as shown in FIG. 5A, the probe pin substrate 100 that is a substrate forming the probe pin 106 is prepared. Then, the groove 102 for forming a protruding portion that acts as a contact portion between the probe pin 106 and a device under test is formed on a surface of the probe pin substrate 100. Specifically, a resist having a pattern of the groove 102 is formed on the surface of the probe pin substrate 100. Then, the groove 102 is formed on the substrate 100 by etching using the resist as an etching mask.

Next, as shown in FIG. 5B, a conductive material is deposited on the surface of the probe pin substrate 100 to form the probe pin 106. The thickness of the probe pin 106 may be about 10 μm. Moreover, it is preferable that the conductive material for forming the probe pin 106 is amorphous alloy. Specifically, the probe pin 106 is formed by a photolithography technique, an etching technique, a lift off technique, etc. That is, a resist having a pattern of the probe pin 106 is formed on the surfaces of the probe pin substrate 100. The conductive material is deposited by, e.g., a sputter technique to form the probe pin 106 after removing the resist in the region on which the probe pin 106 should be formed.

Next, as shown in FIG. 5C, the bump 108, which electrically connects the electric wiring 114 on the circuit board 112 and the probe pin 106, is formed ahead of a position in which the probe pin 106 is in contact with the probe pin substrate 100. The thickness of the bump 108 may be about 20 μm. Moreover, the length of the bump 108 may be about 200 μm in a drawing direction of the probe pin 106. Moreover, it is preferable that the bump 108 is a metal such as gold. Specifically, the bump 108 may be formed by a bump bonder, or may be formed by plating.

Figure 6A:
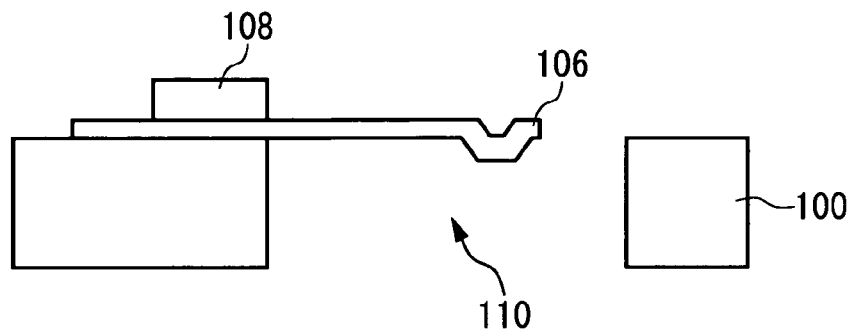
FIGS. 6A to 6C are views exemplary showing a probe pin bending step and a probe pin substrate removing step.
Figure 6B:
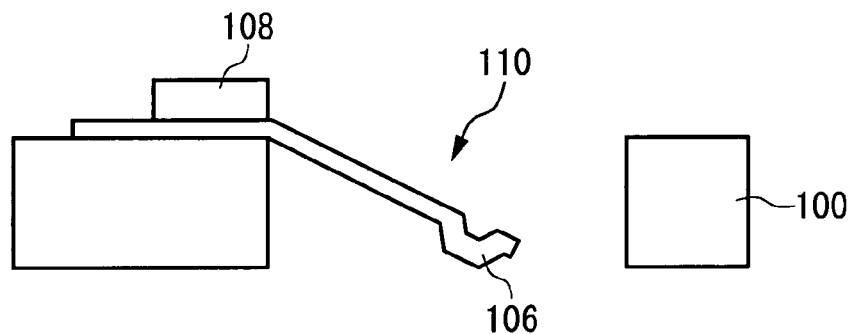
Figure 6C:
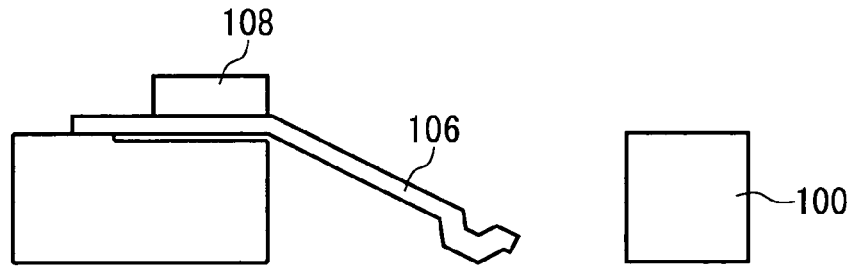

FIGS. 6A to 6C are views exemplary showing a probe pin bending step and a probe pin substrate removing step. In the probe pin bending step, the probe pin 106 is bent in a direction of the probe pin substrate 100. Then, in the probe pin substrate removing step, some portion of the probe pin substrate 100 is removed after the probe pin bending step.

At first, as shown in FIG. 6A, a portion including the groove 102 in the probe pin substrate 100 is removed to form the through-hole 110 in the probe pin substrate 100. Specifically, the through-hole 110 is formed from a rear face of the probe pin substrate 100, e.g., by an etching technique such as inductively coupled plasma etching (ICP), wet an isotropic etching.

Next, as shown in FIG. 6B, the probe pin 106 is bent in a direction of the probe pin substrate 100. Specifically, when the probe pin 106 is formed of amorphous alloy, the probe pin 106 is heated so that the amorphous alloy becomes supercooled fluid. Then, a pressing jig is inserted into the through-hole 110, and the probe pin 106 is pressed and bent by the inserted pressing jig.

Next, as shown in FIG. 6C, a portion, in which the probe pin 106 is separated from the probe pin substrate 100, is formed by removing some portion of the probe pin substrate 100. It is preferable that the portion separated from the probe pin substrate 100 is formed between the position in which the probe pin 106 is in contact with the probe pin substrate 100 and the position in which the probe pin 106 is in contact with the bump 108. That is, it is preferable that the probe pin 106 is separated from the probe pin substrate 100 from a leading edge of the probe pin 106 to a position farther than that of the bump 108.

According to the manufacturing method of the probe card of this example, since a step of forming a resist having a pattern of the sacrifice layer 104, a step of depositing the sacrifice layer 104, etc. can be omitted, it is possible to reduce manufacturing time of the probe card.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to the present invention, there is provided a method of manufacturing a probe card capable of improving yield.

What is claimed is:

1. A method of manufacturing a probe card that electrically connects a testing device and a device under test to transmit a signal between the testing device and the device under test, the method comprising the steps of:

forming a probe pin on a probe pin substrate;

joining the probe pin held on the probe pin substrate to a circuit board; and cutting the probe pin to separate the probe pin substrate from the probe pin, wherein said probe pin forming step comprises the steps of:

depositing a sacrifice layer on a surface of the probe pin substrate;

depositing a conductive material from the surface of the probe pin substrate to a surface of the sacrifice layer to form the probe pin; and removing the sacrifice layer to form a portion in which the probe pin is separated from the probe pin substrate, and wherein said probe pin cutting step comprises the step of cutting the portion of the probe pin, which is separated from the probe pin substrate, while the remaining portion of the probe pin is joined to the probe pin substrate.

2. The manufacturing method as claimed in claim 1, wherein the manufacturing method further comprises the step of forming a bump, which electrically connects electric wiring on the circuit board and the probe pin, ahead of a position in which the probe pin is in contact with the probe pin substrate, and said sacrifice layer removing step comprises the step of removing the sacrifice layer to form the portion separated from the probe pin substrate between the position in which the probe pin is in contact with the probe pin substrate and a position in which the probe pin is in contact with the bump.

3. The manufacturing method as claimed in claim 1, wherein the manufacturing method further comprises the step of removing a portion of the probe pin substrate and bending the probe pin in a direction toward the probe pin substrate, and said sacrifice layer removing step comprises the step of removing the sacrifice layer after said probe pin bending step.

4. The manufacturing method as claimed in claim 1, wherein said probe pin forming step comprises the step of forming a cut portion in which an area of a cross section generally perpendicular to a drawing direction of the probe pin is smaller than that of the rest of the probe pin, and said probe pin cutting step comprises the step of cutting the probe pin at the position of the cut portion.

5. The manufacturing method as claimed in claim 4, wherein said cut portion forming step comprises the step of forming the cut portion having a width narrower than that of the rest of the probe pin.

6. A method of manufacturing a probe card that electrically connects a testing device and a device under test to transmit a signal between the testing device and the device under test, the method comprising the steps of:

forming a probe pin on a probe pin substrate;

joining the probe pin held on the probe pin substrate to a circuit board; and cutting the probe pin to separate the probe pin substrate from the probe pin, wherein said probe pin forming step comprises the steps of:

depositing a conductive material on a surface of the probe pin substrate to form the probe pin; and removing some portion of the probe pin substrate to form a portion in which the probe pin is separated from the probe pin substrate, and wherein said probe pin cutting step comprises the step of cutting the portion of the probe pin, which is separated from the probe pin substrate, while the remaining portion is joined to the probe pin substrate.

7. A method of connecting a probe pin to a circuit board, comprising the steps of:

forming a probe pin on a probe pin substrate;

joining the probe pin held on the probe pin substrate to the circuit board; and cutting the probe pin to separate the probe pin substrate from the probe pin, wherein said probe pin forming step comprises the steps of depositing a sacrifice layer on a surface of the probe pin substrate;

depositing a conductive material from the surface of the probe pin substrate to a surface of the sacrifice layer to form the probe pin; and removing the sacrifice layer to form a portion in which the probe pin is separated from the probe pin substrate, and wherein said probe pin cutting step comprises the step of cutting the portion of the probe pin, which is separated from the probe pin substrate, while the remaining portion of the probe pin is joined to the probe pin substrate.

* * * * *